US007569464B2

(12) United States Patent
Kirmse et al.

(10) Patent No.: US 7,569,464 B2
(45) Date of Patent: Aug. 4, 2009

(54) METHOD FOR MANUFACTURING A SEMICONDUCTOR DEVICE HAVING IMPROVED ACROSS CHIP IMPLANT UNIFORMITY

(75) Inventors: Karen H. R. Kirmse, Richardson, TX (US); Yuanning Chen, Plano, TX (US); Jarvis B. Jacobs, Murphy, TX (US); Deborah J. Riley, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 200 days.

(21) Appl. No.: 11/615,187

(22) Filed: Dec. 22, 2006

(65) Prior Publication Data

US 2008/0153273 A1     Jun. 26, 2008

(51) Int. Cl.
*H01L 21/425* (2006.01)
(52) U.S. Cl. .................. 438/514; 438/230; 438/301; 438/303; 257/E21.002
(58) Field of Classification Search ................ 438/230, 438/301, 303, 514
See application file for complete search history.

(56) References Cited

U.S. PATENT DOCUMENTS 7,098,099 B1 * 8/2006 Hornung et al. ............. 438/229
7,217,625 B2 * 5/2007 Lee et al. .................... 438/303

* cited by examiner

*Primary Examiner*—N Drew Richards
*Assistant Examiner*—Christy L Novacek
(74) *Attorney, Agent, or Firm*—Wade J. Brady, III; Frederick J. Telecky, Jr.

(57) ABSTRACT

The present invention provides a method for manufacturing a semiconductor device, which includes forming a gate structure over a substrate, and forming a stack of layers on the substrate and at least partially along a sidewall of the gate structure. In this embodiment, the stack of layers includes an initial layer located over the substrate, a buffer layer located over the initial layer and an offset layer located over the buffer layer. This embodiment of the method further includes removing horizontal segments of the offset layer and the buffer layer using a dry etch and a wet clean, wherein removing includes choosing at least one of an initial thickness of the buffer layer, a period of time for the dry etch or a period of time for the wet clean such that horizontal segments of the initial layer are exposed and substantially unaffected after the dry etch and wet clean.

18 Claims, 5 Drawing Sheets

METHOD FOR MANUFACTURING A SEMICONDUCTOR DEVICE HAVING IMPROVED ACROSS CHIP IMPLANT UNIFORMITY

TECHNICAL FIELD OF THE INVENTION

The present invention is directed, in general, to a semiconductor device and, more specifically, to a method for manufacturing a semiconductor device having improved across chip implant uniformity.

BACKGROUND OF THE INVENTION

Various conductive regions may be formed by the implantation of one or more dopants into the layers of a semiconductor device. For example, a dopant may be implanted within a semiconductor body on either side of a gate stack to form source/drain extension implants. Similarly, a dopant (e.g., more heavily doped than the source/drain extension implants) may be implanted within the semiconductor body on either side of sidewall spacers located along the gate stack to form source/drain implants. Other implants also exist.

It is important, at least in many of today's technology nodes, that the implant depth and dose for a given implant (e.g., for the source/drain extension implants, source/drain implants, etc.) have little or no variation across the chip. The industry, however, is generally unable to accurately or easily achieve the aforementioned across chip implant uniformity. This is particularly evident in those manufacturing processes that require screening layers for a plurality of manufacturing reasons.

Accordingly, what is needed in the art is a method for manufacturing a semiconductor device that can accurately and easily achieve across chip implant uniformity.

SUMMARY OF THE INVENTION

To address the above-discussed deficiencies of the prior art, the present invention provides a method for manufacturing a semiconductor device. The method for manufacturing the semiconductor device, in one embodiment, includes forming a gate structure over a substrate, and forming a stack of layers on the substrate and at least partially along a sidewall of the gate structure. In this embodiment, the stack of layers includes an initial layer located over the substrate, a buffer layer located over the initial layer and an offset layer located over the buffer layer. This embodiment further includes removing horizontal segments of the offset layer and the buffer layer using a dry etch and a wet clean, wherein removing includes choosing at least one of an initial thickness of the buffer layer, a period of time for the dry etch or a period of time for the wet clean such that horizontal segments of the initial layer are exposed and substantially unaffected after the dry etch and wet clean.

In an alternative embodiment, the method may include: (1) forming a gate structure over a substrate, (2) forming a stack of layers on the substrate and at least partially along a sidewall of the gate structure, wherein the stack of layers includes a grown oxide layer located over the substrate, a deposited oxide layer located over the grown oxide layer and a nitride layer located over the buffer layer, (3) subjecting the stack of layers to a dry etch for a first period of time, the dry etch removing horizontal segments of the nitride layer thereby forming one or more offset spacers and leaving at least a portion of horizontal segments of the deposited oxide layer remaining over the substrate, and (4) subjecting the at least a portion of the horizontal segments of the deposited oxide layer to a wet clean for a second period of time to substantially remove the horizontal segments of the deposited oxide layer, wherein at least one of an initial thickness of the deposited oxide layer, the first period of time or the second period of time is chosen to leave horizontal segments of the grown oxide layer exposed and substantially unaffected after the wet clean.

BRIEF DESCRIPTION OF THE DRAWINGS

For a more complete understanding of the invention, reference is now made to the following descriptions taken in conjunction with the accompanying drawings, in which.

DETAILED DESCRIPTION

Figure 1:
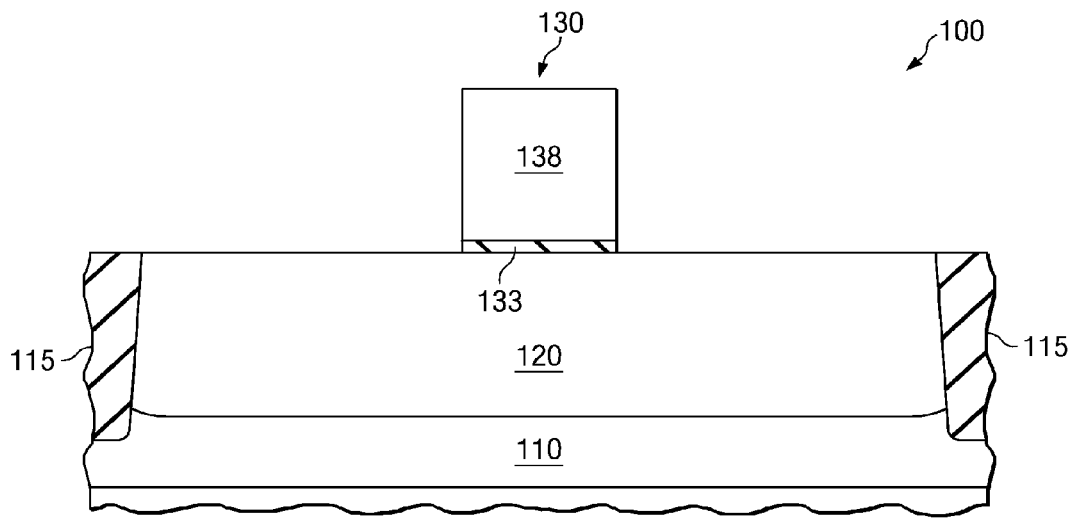
FIGS. 1-8 illustrate views of detailed manufacturing steps showing how one might manufacture a semiconductor device in accordance with the invention.

The invention is based, at least in part, on the acknowledgement that the non-uniform thickness of a screening layer formed on a semiconductor substrate (e.g., an initial layer, a screen oxide, poly-ox layer, etc.) may lead to uniformity issues for the dopants ultimately implanted therethrough. For example, the present inventors have recognized that the non-uniform thickness of the screening layer caused by, for example the etching of the offset spacers, tends to cause the dopants, and more particularly the depth of the peak dopant concentration of the dopants, to be non-uniform across the semiconductor substrate. This dopant non-uniformity has been known to cause inconsistent transistor performance. Also, dopants previously trapped in the screening layer can be lost as this layer varies, making them unavailable to outdiffuse with subsequent anneals. The interaction of the thickness variation interaction and subsequent processes (e.g., anneals, cleans, etc.) has been know to cause inconsistent transistor performance, for example because of the resulting dopant non-uniformity.

Given the aforementioned acknowledgement, the present inventors recognize that the process for forming and etching the offset spacers can be modified to leave the screening layer substantially unaffected after forming the offset spacers. The standard process for forming the offset spacers includes subjecting the offset spacer layer, a buffer layer located thereunder, and the screening layer located thereunder to a dry etch process. The prior art dry etch process attempts, quite unsuccessfully, to stop at or near the screening layer. Unfortunately, the dry etch process typically etches varying different depths into the screening layer. The dry etch process is then followed by a wet clean process designed to remove etch residue remaining after the dry etch.

Based upon the forgoing, and a significant amount of experimentation, the inventors recognize that the wet clean may be used to materially etch one or more of the layers, and not only be used as a clean as was the case in the prior art. For example, the inventors recognize that if the dry etch etches through the offset spacer layer and only partially into the buffer layer, that the wet clean process could then be used to remove the remaining portion of the buffer layer. Again, heretofore the invention, the wet clean process was only used to clean the surface of the resulting buffer layer or the screening layer, as opposed to being used to remove the remaining portion of the buffer layer, as it is here. Because the wet clean process may be chosen to be selective to the buffer layer, the buffer layer may be easily removed, thus leaving the screening layer exposed and substantially unaffected after the dry etch and wet clean. The dry etch process of the prior art does not have this selectivity.

In using the wet etch to remove any remaining portion of the buffer layer, the present inventors have recognized that at least one of an initial thickness of the buffer layer, a period of time for the dry etch or a period of time for the wet clean may be specifically chosen (e.g., tailored) such that horizontal segments of the initial layer are exposed and substantially unaffected after the dry etch and wet clean. In one embodiment, at least two of those criteria is specifically tailored, and in another embodiment all three of them are tailored. Accordingly, the process for etching the layers may be tailored, to whatever degree is needed, to allow the wet etch to be used as a removal technique as compared to a cleaning technique.

FIGS. 1-8 illustrate views of detailed manufacturing steps showing how one might manufacture a semiconductor device in accordance with the invention. FIG. 1 illustrates a semiconductor device 100 at an initial stage of manufacture. The device 100 of FIG. 1 includes a substrate 110. The substrate 110 may, in one embodiment, be any layer located in the device 100, including a wafer itself or a layer located above the wafer (e.g., epitaxial layer). In the embodiment of FIG. 1 the substrate 110 is a p-type substrate; however, one skilled in the art understands that the substrate 110 might be an n-type substrate without departing from the invention.

Located within the substrate 110 of FIG. 1 are isolation structures 115 and a well region 120. The isolation structures 115 of FIG. 1 are trench isolation structures, and more particularly shallow trench isolation structures. The isolation structures 115, however, could comprise other types of isolation structures. For example, in another embodiment the isolation structures 115 are grown isolation structures, such as Locos isolation structures.

The well region 120 in the embodiment of FIG. 1 contains an n-type dopant. For example, the well region 120 would likely be doped with an n-type dopant dose ranging from about 1E13 atoms/cm$^2$ to about 1E14 atoms/cm$^2$ and at an energy ranging from about 100 keV to about 500 keV. This results in the well region 120 having a peak dopant concentration ranging from about 5E17 atoms/cm$^3$ to about 1E19 atoms/cm$^3$, among others. If the dopants were reversed the well region 120 might contain a p-type dopant.

Located over the substrate 110 in the embodiment of FIG. 1 is a gate structure 130. The gate structure 130 includes a gate dielectric layer 133 and a gate electrode layer 138. The gate dielectric layer 133 may comprise various different materials. For example, the gate dielectric layer 133 may comprise silicon dioxide, or in an alternative embodiment comprise a high dielectric constant (k) material. In the embodiment of FIG. 1, however, the gate dielectric layer 133 is a silicon dioxide layer having a thickness ranging from about 0.5 nm to about 5 nm.

Any one of a plurality of manufacturing techniques could be used to form the gate dielectric layer 133. For example, the gate dielectric layer 133 may be either grown or deposited. Additionally, the growth or deposition steps may require a significant number of different temperatures, pressures, gasses, flow rates, etc.

The gate electrode layer 138 may also comprise many different materials. For example, the gate electrode layer 138 may comprise standard polysilicon, amorphous polysilicon, metal, etc., while remaining within the bounds of this invention. Nevertheless, in the embodiment of FIG. 1 the gate electrode layer 138 comprises standard polysilicon.

The formation conditions for the gate electrode layer 138 may vary, however, if the gate electrode layer 138 were to comprise standard polysilicon, such as the instance in FIG. 1, the gate electrode layer 138 could be deposited using a pressure ranging from about 100 torr to about 300 torr, a temperature ranging from about 620° C. to about 700° C., and a $SiH_4$ or $Si_2H_6$ gas flow ranging from about 50 sccm to about 150 sccm. If, however, amorphous silicon were desired, the amorphous silicon gate electrode could be deposited using a pressure ranging from about 100 torr to about 300 torr, a temperature ranging from about 450° C. to about 550° C., and a $SiH_4$ or $Si_2H_6$ gas flow ranging from about 100 sccm to about 300 sccm. In any instance, the gate electrode layer 138 might have a thickness ranging from about 50 nm to about 150 nm, among other usable thicknesses.

Figure 2:
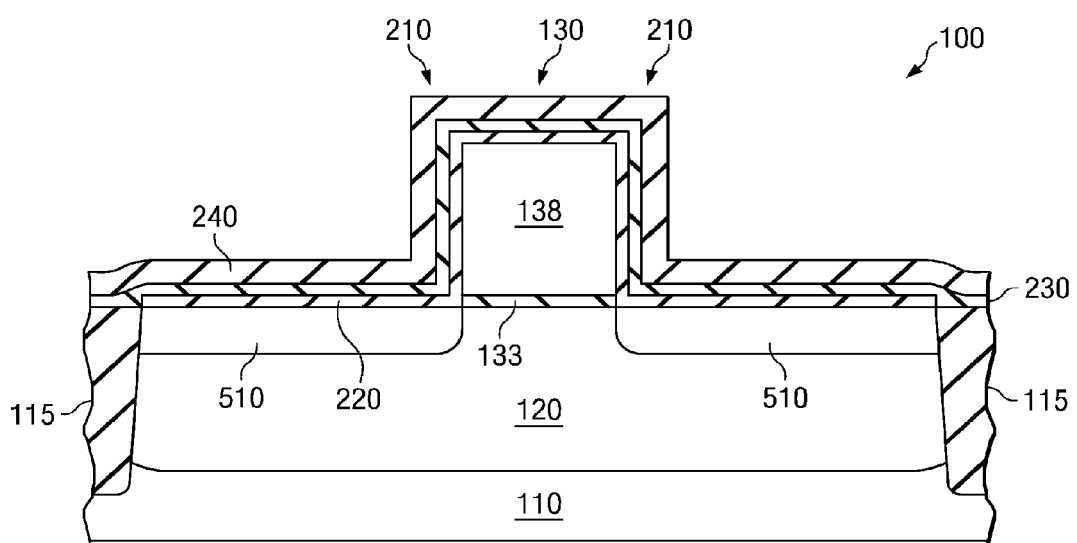

FIG. 2 illustrates the semiconductor device 100 of FIG. 1 after the formation of a stack of layers 210 on the substrate 110 and at least partially along a sidewall of the gate structure 130. In the embodiment of FIG. 2, the stack of layers 210 is conformally formed on the substrate 110, as well as along the sidewalls and top of the gate structure 130. Nevertheless, certain embodiments may exist where the stack of layers 210 is not located on an upper surface of the gate structure 130.

The stack of layers 210 illustrated in FIG. 2 includes an initial layer 220, a buffer layer 230 and an offset spacer layer 240. While the stack of layers 210 should include at least these three layers, other embodiments may exist wherein the stack of layers 210 includes additional layers. Accordingly, the present invention should not be limited to only the three layers 220, 230, 240, shown in FIG. 2.

The initial layer 220 shown in the embodiment of FIG. 2 is located on the substrate 110 and on a sidewall of the gate structure 130. The initial layer 220 may comprise any material that may be used as a screening layer. In one embodiment, the initial layer 220 could comprise a material and be formed using a process that would allow the initial layer 220 to have a uniform thickness across the substrate 110. Uniform thickness, as used with respect to this embodiment, means that the as-formed thickness of the initial layer 220 would vary by less than about 2% across the substrate 210.

One material that might be used as the initial layer 220 and meet one or more of the aforementioned desires is an oxide. For instance, the initial layer 220 could comprise a grown oxide. The grown oxide functions well as a screening layer. Additionally, grown oxides may be consistently and uniformly formed to a desired thickness. For instance, the grown oxide might be formed to a uniform thickness ranging from about 1 nm to about 3 nm. The initial layer 220 may comprise other materials as well.

Located over the initial layer 220 is the buffer layer 230. The buffer layer 230, in this embodiment, provides a buffer for the first dry etch 310 (FIG. 3) While the buffer layer 230 may comprise many different materials, one embodiment suggests that the buffer layer 230 comprise a material that may be removed (e.g., with high selectivity) using a wet clean 410 (FIG. 4). One material that provides the aforementioned properties is a deposited oxide, such as tetraethylorthosilicate (TEOS). However, other materials such as disilane and silane, among others, could also be used.

The buffer layer 230 may be formed to any thickness that provides the appropriate buffer for the dry etch. In the illustrative embodiment of FIG. 2, the buffer layer 230 has a thickness ranging from about 3 nm to about 20 nm. Other thicknesses could, nonetheless, also be used. It should be noted that the chosen thickness for the buffer layer 230 may depend, in some embodiments, on the time for the dry etch. In other embodiments, the time for the dry etch may be chosen based upon the thickness of the buffer layer 230.

Located over the buffer layer 230 is the offset layer 240. The offset layer 240, in this embodiment, is configured to offset source/drain extension implants 510 (FIG. 5) from the gate structure 130. The offset layer 240 may comprise many different materials. In one embodiment the offset layer 240 comprises a material different from the buffer layer 230 and initial layer 220, thus providing some degree of etch selectivity. One material that provides great etch selectivity with an oxide, and is commonly used in the manufacture of semiconductor devices, is a nitride. Accordingly, in one embodiment the offset layer 240 comprises a nitride. Nevertheless, the offset layer 240 may comprise other materials, for example a silicon nitride layer having carbon therein in one embodiment.

Figure 3:
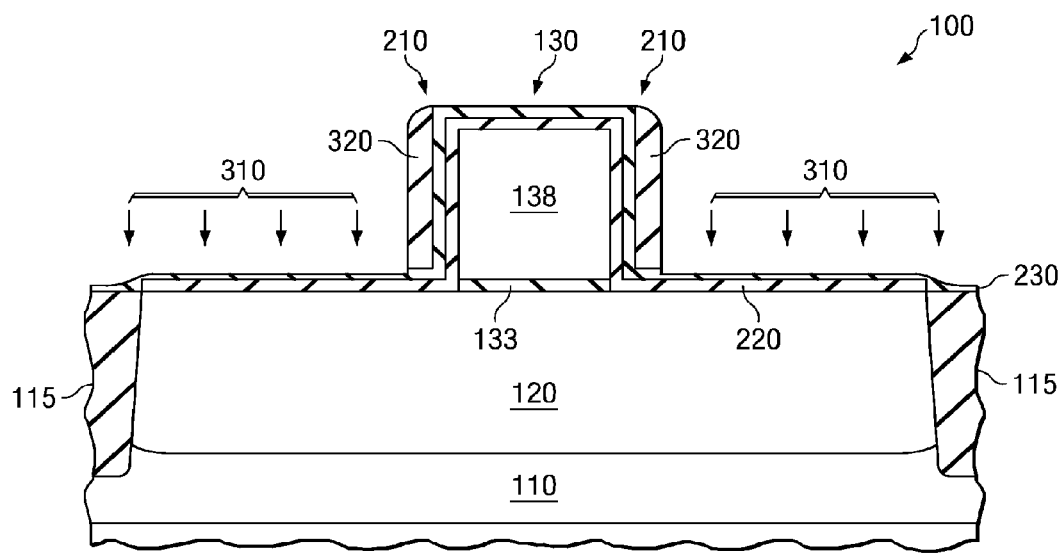
Figure 4:
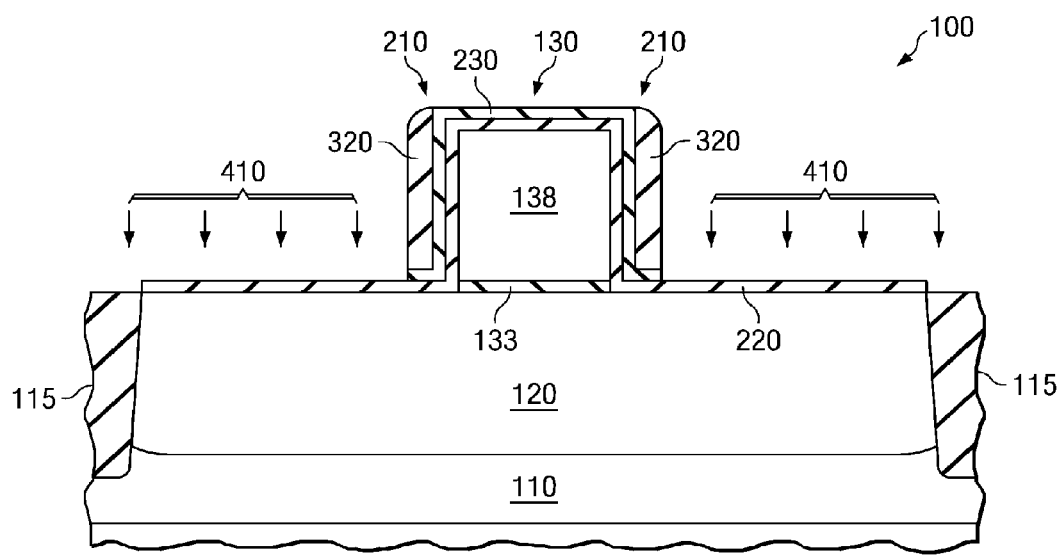

FIG. 3 illustrates the device 100 of FIG. 2 after subjecting the stack of layers 210 to a dry etch 310. Dry etch, and used herein, means a plasma removal process that is capable of being conducted in a controlled manner. The dry etch 310, in this embodiment, removes horizontal segments of the offset layer 240 thereby forming one or more offset spacers 320. Horizontal, as used in this context, means those portions located somewhat along the substrate 110, as compared to those portions located somewhat along the gate structure 130, which would in turn be considered vertical portions. The dry etch 310, as is further illustrated, leaves at least a portion of horizontal segments of the buffer layer 230 remaining over the substrate 110. In one embodiment, the dry etch 310 leaves less than about 5.0 nm thickness of the horizontal segments of the buffer layer 230 remaining over the substrate 110. In an alternative embodiment, the thickness remaining is less than about 3.0 nm.

The thickness of the horizontal portions of the buffer layer 230 remaining after the dry etch 310 is important, in certain embodiments. For example, the subsequent wet clean 410 (FIG. 4) should be capable of removing the remaining horizontal portions of the buffer layer 230. In those instances wherein the horizontal portions of the buffer layer 230 are too thick, the period of time for conducting the subsequent wet clean 410 may be too long. If the wet clean 410 is conducted for too much time, it may end up undercutting portions of the offset spacers 320.

The dry etch 310 may comprise a variety of different etchants, times and etch conditions and remain within the purview of the invention. For example, in one embodiment the dry etch 310 uses an anisotropic etchant comprising $CF_4$/$CHF_3$/Ar, and is conducted for a period of time ranging from about 15 to about 30 seconds. In an alternative embodiment, the dry etch 310 might use an etchant comprising $CH_3F$/$O_2$ and be conducted for a period of time ranging from about 10 to about 25 seconds. Again, however, the dry etch 310 used and the period of time for exposing the device 100 to the dry etch 310 should be chosen to leave at least a portion of the horizontal segments of the buffer layer 230 remaining after its completion.

FIG. 4 illustrates the device 100 of FIG. 3 after subjecting the remaining horizontal portions of the buffer layer 230 to a wet clean 410. Wet clean, and used herein, means the processing of wafers in liquid chemical solutions to remove organics, particles, metallic contaminants and/or to etch away films on the wafer surface. The wet clean 410, in this embodiment, is conducted for a period of time sufficient to substantially remove the remaining horizontal portions of the buffer layer 230, and thus leave the horizontal portions of the initial layer 220 exposed and substantially unaffected. Substantially unaffected, as used in one embodiment, means that less than about 0.7 nm of the initial layer 220 is removed using the wet clean 410. Substantially unaffected, as used in another embodiment, means that less than about 0.4 nm of the initial layer 220 is removed using the wet clean 410.

The wet clean 410, in one embodiment, is highly selective to the buffer layer 230, at least as compared to the initial layer 220. In one embodiment the wet clean 410 comprises a mixture of about 25-30% ammonium hydroxide, about 30% hydrogen peroxide, and water mixed at an $NH_4OH$/$H_2O_2$ volume ratio between about 1:1 and about 1:10 and an $NH_4OH$/$H_2O$ volume ratio between about 1:1 and about 1:100, and at a temperature ranging from about 25° C. to about 80° C. This type of clean can offer selectivities of more than 7:1 to buffer layer 230 material, and thus tends to permit minimal impact of the initial layer 220 when it comes in contact therewith. In an alternative embodiment, the wet clean 410 comprises about 49% Hydrofluoric acid and water mixed at a volume ratio between 1:10 and 1:1000, and at a temperature ranging from about 25° C. to about 40° C. This alternative embodiment is also selective to the buffer layer 230 material.

While the wet clean 410 tends to be selective to the buffer layer 230 material, the device 100 should not be subjected to the wet clean 410 for an excessive period of time. For instance, as mentioned above, subjecting the device 100 to the wet clean 410 for an excessive period of time tends to undercut the offset spacers 320, which is generally undesirable. Thus, in one embodiment the device 100 should be subjected to the wet clean 410 for a period of time that does not exceed 130% of the time needed to clear the buffer layer 230.

As the initial layer 220 remains substantially unaffected after the wet clean, it should have substantially the same thickness as it originally had when it was formed. Therefore, the process for etching the stack of layers 210 has little effect on the initial layer 220. Accordingly, the formation process for the initial layer 220 is the major remaining factor needed to provide a substantially uniform screening layer.

Figure 5:
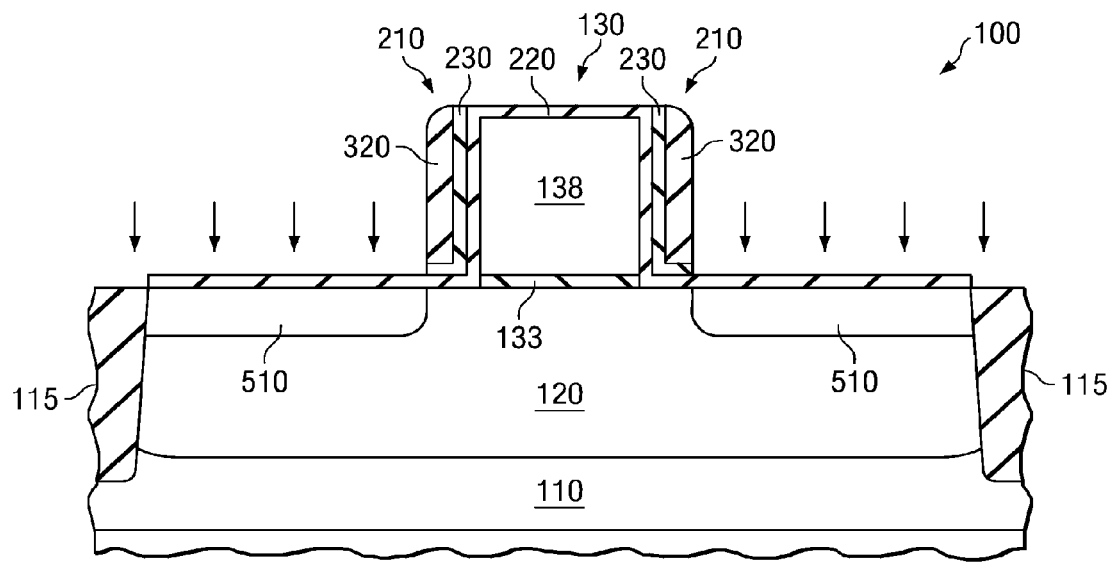

FIG. 5 illustrates the device 100 of FIG. 4 after the formation of source/drain extension implants 510 within the substrate 110. In this embodiment, the source/drain extension implants 510 are implanted through the remaining initial layer 220. The source/drain extension implants 510 may be formed to have a peak dopant concentration ranging from about 1E19 atoms/cm$^3$ to about 2E20 atoms/cm$^3$, among others. The source/drain extension implants 510 may also have a dopant type opposite to that of the well region 120 they are located within. In this embodiment the source/drain extension implants 510 would be doped with a P-type dopant. Other dopants may also be co-implanted at this point in the process flow. In particular, halo or pocket implants, whether at angles or not, may also be conducted at this point.

Because of the uniform thickness of the initial layer 220 a depth of the peak dopant concentration of the source/drain extension implants 510 should vary very little across the substrate 110. Other dopants implanted through the initial layer 220 should show similar results. Also, dopants previously trapped in this initial layer 220 are likewise unaffected.

Figure 6:
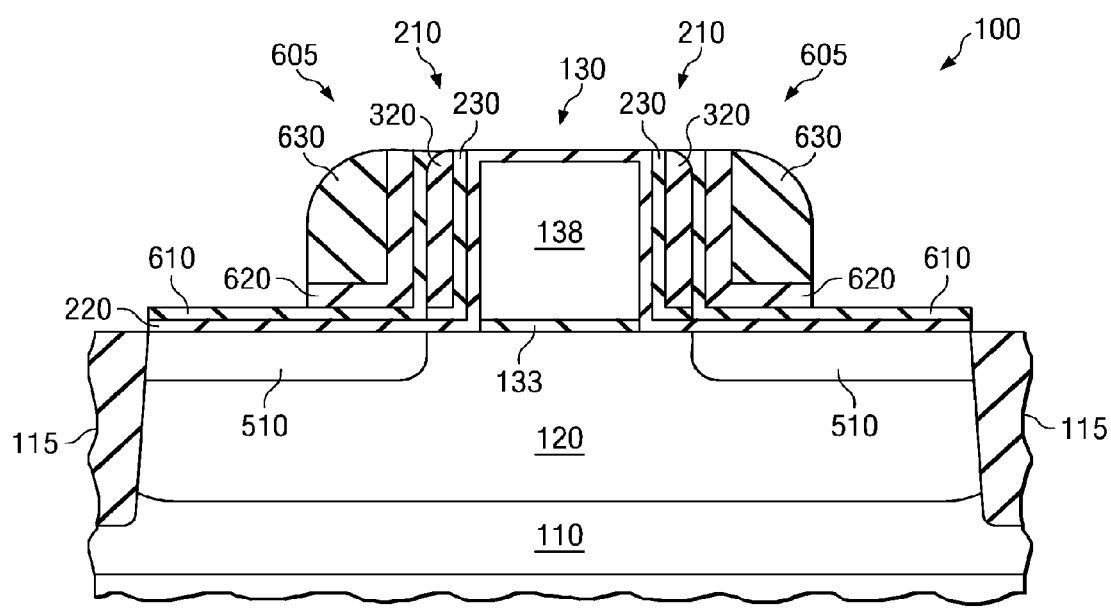

FIG. 6 illustrates the device 100 of FIG. 5 after forming source/drain sidewall spacers 605. In the illustrative embodiment, the source/drain sidewall spacers 605 comprise cap portions 610, L-shaped portions 620 and bulk portions 630. While the cap portions 610 may comprise different materials, one embodiment has the cap portions 610 comprising an oxide. In this embodiment, the cap portions 610 might be grown or deposited using a process similar to that used to form the initial layer 220 or buffer layer 230.

The L-shaped portions 620 may comprise various different types of materials. In one embodiment the L-shaped portions 620 comprise a nitride. In another embodiment, the L-shaped portions 620 comprise a nitride that includes carbon. The carbon typically causes the L-shaped portions 620 to etch at a slower rate than a traditional nitride layer. Other embodiments also exist where the L-shaped portions 620 do not comprise a nitride or contain the carbon.

The bulk portions 630 that are located over the L-shaped portions 620 may be conventional. In the given embodiment of FIG. 6, the bulk portions 630 were blanket deposited and then subjected to an anisotropic etch. In this embodiment, the anisotropic etch also etches the L-shaped portions 620 located therebelow.

Those skilled in the art understand that the source/drain sidewall spacers 605 illustrated in FIG. 6 are but one example of sidewall spacers. For instance, other embodiments exist wherein the cap portions and bulk portions 630 are used, but the L-shaped portions 620 are not. Other combinations also exist.

Figure 7:
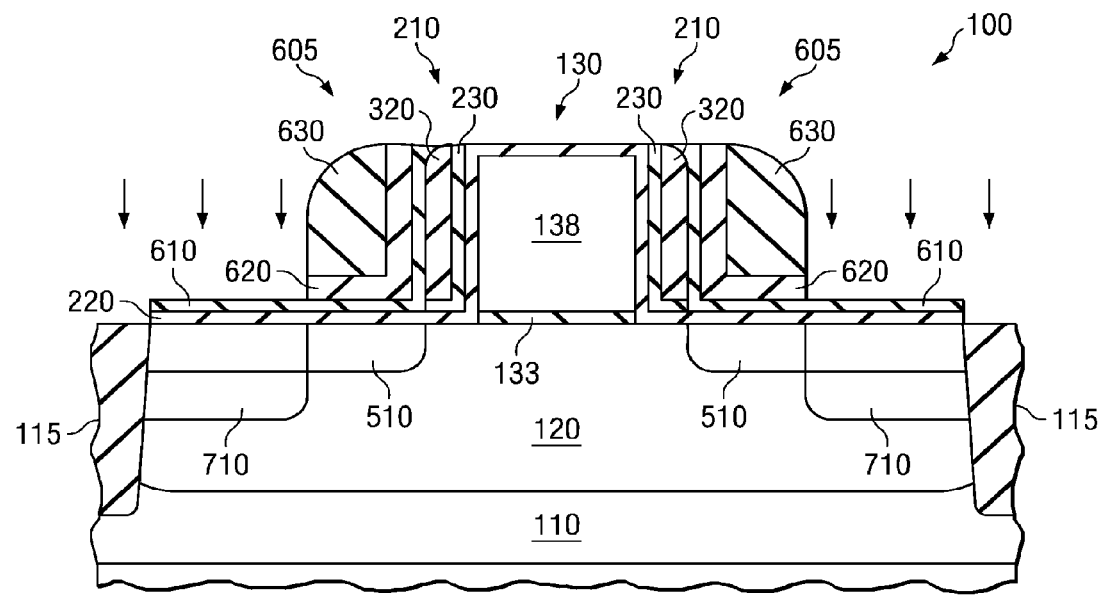

FIG. 7 illustrates the device 100 of FIG. 6 after the formation of source/drain implants 710 within the substrate 110. Those skilled in the art understand the processes that could be used to form the source/drain implants 710. Generally the source/drain implants 710 have a peak dopant concentration ranging from about 1E18 atoms/cm$^3$ to about 1E21 atoms/cm$^3$. Also, the source/drain implants 710 should typically have a dopant type opposite to that of the well region 120 they are located within. Accordingly, the source/drain implants 710 are doped with a p-type dopant in the illustrative embodiment shown in FIG. 7.

Figure 8:
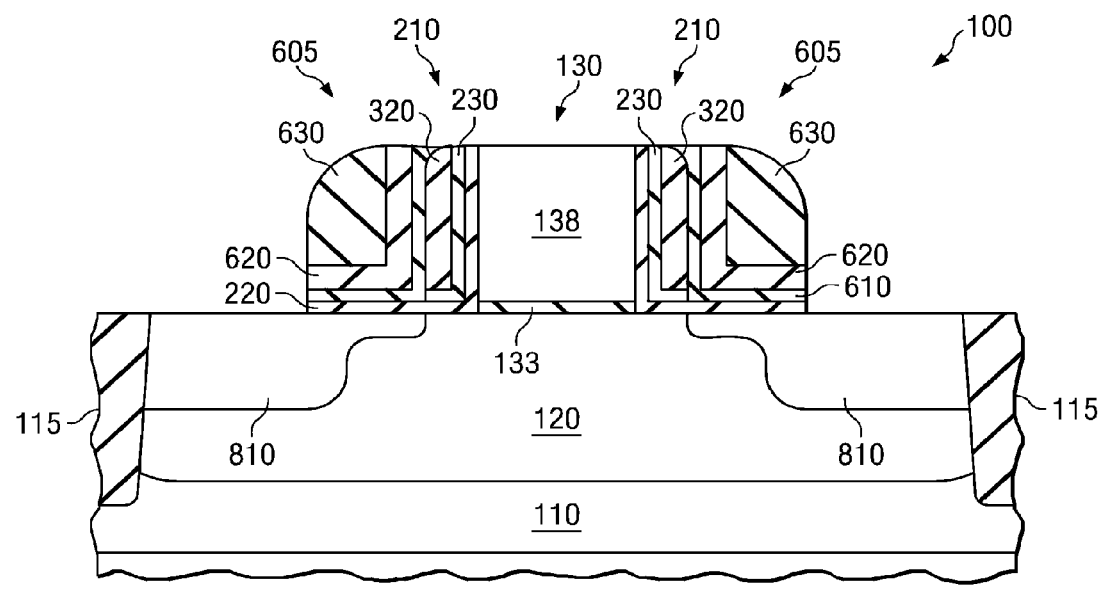

FIG. 8 illustrates the device 100 of FIG. 7 after annealing the source/drain implants 710 and source/drain extension implants 510 to form source/drain regions 810. Various different anneal conditions could be used to form the source/drain regions 810. In the current embodiment, the thermal anneal is conducted at a temperature of greater than about 800° C., and in one embodiment a temperature ranging from about 900° C. to about 1300° C. Often the thermal anneal is a spike anneal, "refined" spike anneal or a flash anneal, however, other timed anneals might also be used. It should be noted that not only does the anneal activate the source/drain regions 810, it also substantially fixes any silicon imperfections caused by the previous implantation processes.

The embodiment of FIG. 8 also illustrates that at least a portion of the horizontal segments of the initial layer 220 and cap portion 610 may be removed. Those skilled in the art understand the process and chemistry that could be used to etch the initial layer 220 and the cap portion 610. For example, in one embodiment a mixture of hydrofluoric acid and water at room temperature could be used.

The above discussion has been directed to addressing across wafer thickness variations in the initial layer (e.g., screening layer). However, the invention is equally applicable to wafer-to-wafer thickness variations in the initial layer, as well as lot-to-lot thickness variations in the initial layer. Accordingly, the above discussion should not be limited to one specific use.

Figure 9:
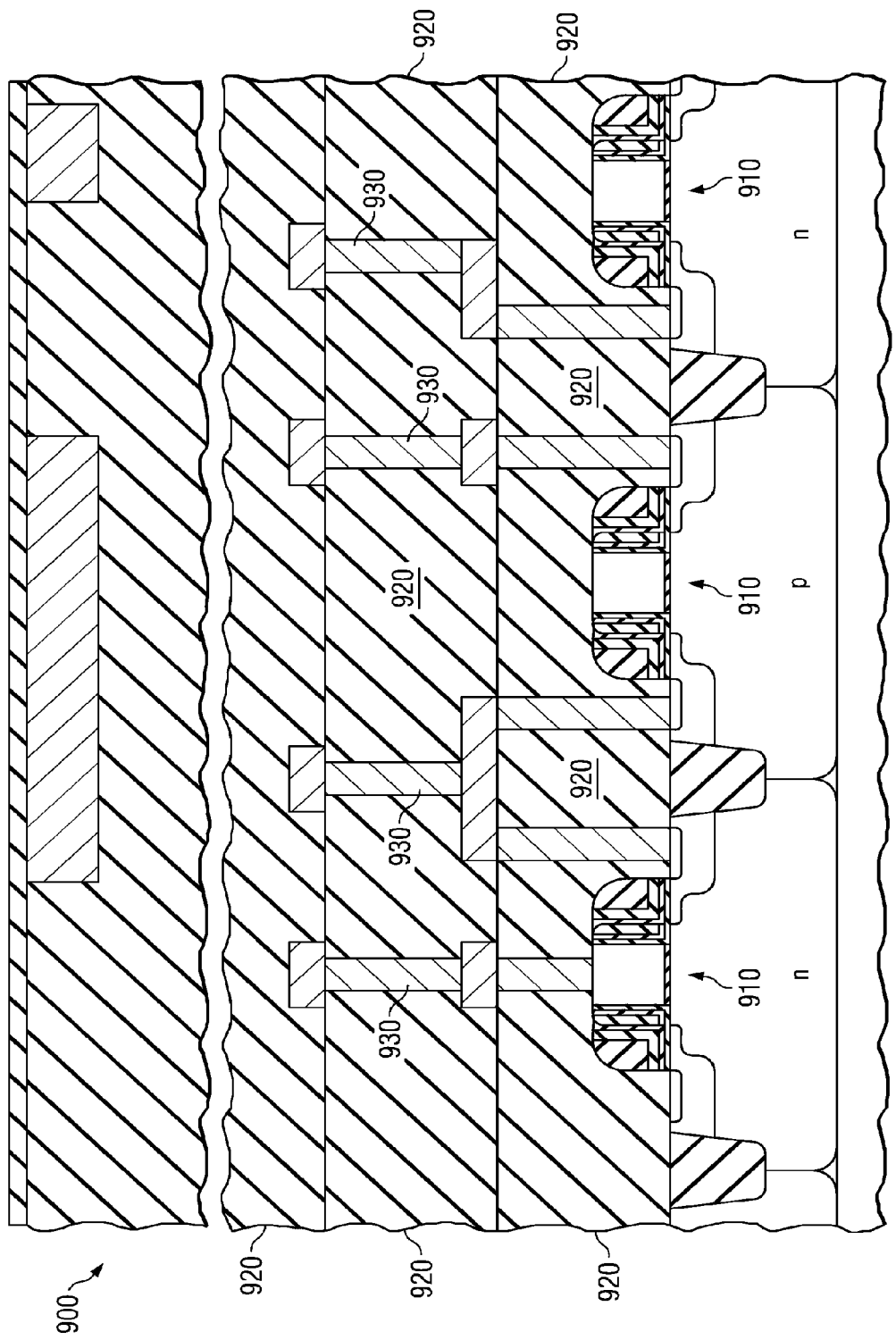
FIG. 9 illustrates an integrated circuit (IC) incorporating a semiconductor device constructed according to the invention.

FIG. 9 illustrates an integrated circuit (IC) 900 incorporating a semiconductor device 910 constructed according to the invention. The IC 900 may include devices, such as transistors used to form CMOS devices, BiCMOS devices, bipolar devices, or other types of devices. The IC 900 may further include passive devices, such as inductors or resistors, or it may also include optical devices or optoelectronic devices. Those skilled in the art are familiar with these various types of devices and their manufacture. In the particular embodiment illustrated in FIG. 9, the IC 900 includes the semiconductor device 910 having dielectric layers 920 located there over. Additionally, interconnect structures 930 are located within the dielectric layers 920 to interconnect various devices, thus, forming the operational integrated circuit 900.

Those skilled in the art to which the invention relates will appreciate that other and further additions, deletions, substitutions and modifications may be made to the described embodiments without departing from the scope of the invention.

What is claimed is:

1. A method for manufacturing a semiconductor device, comprising:
   forming a gate structure over a substrate;
   forming a stack of layers on the substrate and at least partially along a sidewall of the gate structure, wherein the stack of layers includes an initial layer located over the substrate, a buffer layer located over the initial layer and an offset layer located over the buffer layer;
   removing horizontal segments of the offset layer and the buffer layer using a dry etch and a wet clean, wherein removing includes choosing at least one of an initial thickness of the buffer layer, a period of time for the dry etch or a period of time for the wet clean such that horizontal segments of the initial layer are exposed and substantially unaffected after the dry etch and wet clean;
   implanting source/drain regions through the substantially unaffected horizontal segments of the initial layer; and
   forming a source/drain sidewall spacer along the sidewall of the gate structure, the stack of layers comprising the initial layer, the buffer layer and the offset layer separating the source/drain sidewall spacer from the gate structure.

2. The method as recited in claim 1 wherein the initial layer comprises a grown oxide layer, the buffer layer comprises a tetraethylorthosilicate (TEOS) layer, and the offset layer comprises a nitride layer.

3. The method as recited in claim 1 wherein the dry etch removes the horizontal segments of the offset layer thereby forming one or more offset spacers and leaving at least a portion of the horizontal segments of the buffer layer remaining over the substrate.

4. The method as recited in claim 3 wherein the dry etch leaves less than about 5.0 nm thickness of the horizontal segments of the buffer layer remaining over the substrate.

5. The method as recited in claim 3 wherein the dry etch leaves less than about 3.0 nm thickness of the horizontal segments of the buffer layer remaining over the substrate.

6. The method as recited in claim 3 wherein the wet clean substantially removes the remaining horizontal segments of the buffer layer to expose the initial layer.

7. The method as recited in claim 1 wherein the wet clean comprises a mixture of ammonium hydroxide, hydrogen peroxide and water or a mixture of hydrofluoric acid and water.

8. The method as recited in claim 1 wherein the dry etch occurs before the wet clean.

9. The method as recited in claim 1 further including forming interconnects within dielectric layers located over the gate structure, at least one of the interconnects contacting the gate structure and forming an integrated circuit.

10. The method as recited in claim 1 wherein implanting source/drain regions includes implanting source/drain extension implants.

11. A method for manufacturing a semiconductor device, comprising:
   forming a gate structure over a substrate;

forming a stack of layers on the substrate and at least partially along a sidewall of the gate structure, wherein the stack of layers includes a grown oxide layer located over the substrate, a deposited oxide layer located over the grown oxide layer and a nitride layer located over the deposited oxide layer;

subjecting the stack of layers to a dry etch for a first period of time, the dry etch removing horizontal segments of the nitride layer thereby forming one or more offset spacers and leaving at least a portion of horizontal segments of the deposited oxide layer remaining over the substrate;

subjecting the at least a portion of the horizontal segments of the deposited oxide layer to a wet clean for a second period of time to substantially remove the horizontal segments of the deposited oxide layer, wherein at least one of an initial thickness of the deposited oxide layer, the first period of time or the second period of time is chosen to leave horizontal segments of the grown oxide layer exposed and substantially unaffected after the wet clean;

implanting one or more dopants through the substantially unaffected grown oxide layer and into into the substrate; and forming a source/drain sidewall spacer along the sidewall of the gate structure, the stack of layers comprising the grown oxide layer, the deposited oxide layer and the nitride layer separating the source/drain sidewall spacer from the gate structure.

12. The method as recited in claim 11 wherein the dry etch leaves less than about 5.0 nm thickness of the horizontal segments of the deposited oxide layer remaining over the substrate.

13. The method as recited in claim 11 wherein the dry etch leaves less than about 3.0 nm thickness of the horizontal segments of the deposited oxide layer remaining over the substrate.

14. The method as recited in claim 11 wherein the wet clean comprises a mixture of ammonium hydroxide, hydrogen peroxide and water or a mixture of hydrofluoric acid and water.

15. The method as recited in claim 11 wherein at least two of an initial thickness of the deposited oxide layer, the first period of time or the second period of time are chosen.

16. The method as recited in claim 11 wherein each of an initial thickness of the deposited oxide layer, the first period of time or the second period of time is chosen.

17. The method as recited in claim 11 further including forming interconnects within dielectric layers located over the gate structure, at least one of the interconnects contacting the gate structure and forming an integrated circuit.

18. The method as recited in claim 11 wherein implanting source/drain regions includes implanting source/drain extension implants.

* * * * *